US009224582B2

(12) United States Patent
Forster et al.

(10) Patent No.: US 9,224,582 B2
(45) Date of Patent: Dec. 29, 2015

(54) APPARATUS AND METHOD FOR DEPOSITING ELECTRICALLY CONDUCTIVE PASTING MATERIAL

(75) Inventors: John Forster, San Francisco, CA (US); Anantha Subramani, San Jose, CA (US); Wei D. Wang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1184 days.

(21) Appl. No.: 11/947,459

(22) Filed: Nov. 29, 2007

(65) Prior Publication Data

US 2009/0142512 A1 Jun. 4, 2009

(51) Int. Cl.
*C23C 14/34* (2006.01)
*H01J 37/32* (2006.01)
*H01L 21/02* (2006.01)
*H01L 21/67* (2006.01)

(52) U.S. Cl.
CPC ..... *H01J 37/32477* (2013.01); *H01J 37/32495* (2013.01); *H01L 21/02043* (2013.01); *H01L 21/67005* (2013.01)

(58) Field of Classification Search
CPC ..................... H01J 37/32495; H01J 37/32477; H01L 21/02043; H01L 21/67005
USPC ............................ 204/298.11, 298.12, 298.31
See application file for complete search history.

(56) References Cited

U.S. PATENT DOCUMENTS

| 5,085,727 | A |   | 2/1992  | Steger |              |
|-----------|---|---|---------|--------|--------------|
| 5,358,615 | A | * | 10/1994 | Grant et al. | 204/192.15 |
| 5,382,339 | A |   | 1/1995  | Aranovich |           |
| 5,414,283 | A | * | 5/1995  | den Boer et al. | 257/59 |
| 5,556,501 | A | * | 9/1996  | Collins et al. | 156/345.38 |
| 6,045,670 | A | * | 4/2000  | Adams et al. | 204/298.11 |
| 6,468,404 | B2 |  | 10/2002 | Lu et al. |            |
| 6,699,375 | B1 |  | 3/2004  | Crocker |             |
| 6,736,946 | B2 | * | 5/2004 | Hixson et al. | 204/298.11 |

(Continued)

FOREIGN PATENT DOCUMENTS

| JP | 09-275082 A  | 10/1997 |
|----|--------------|---------|
| JP | 2006-299333 A | 11/2006 |
| TW | 380278 B     | 1/2000  |
| TW | 524885 B     | 3/2003  |

OTHER PUBLICATIONS

Notification of Transmittal of The International Search Report and Written Opinion of the International Search Authority, or the Declaration for International Application No. PCT/US2008/084753 dated Jul. 14, 2009.

(Continued)

*Primary Examiner* — Jason M Berman

(74) *Attorney, Agent, or Firm* — Patterson & Sheridan, LLP

(57) ABSTRACT

A method and apparatus are described for reducing particle contamination in a plasma processing chamber. In one embodiment, a pasting disk is provided which includes a disk-shaped base of high-resistivity material that has an electrically conductive pasting material layer applied to a top surface of the base so that the pasting material layer partially covers the top surface of the base. The pasting disk is sputter etched to deposit conductive pasting material over a wide area on the interior surfaces of a plasma processing chamber while minimizing deposition on dielectric components that are used to optimize the sputter etch process during substrate processing.

17 Claims, 13 Drawing Sheets

(56) References Cited

U.S. PATENT DOCUMENTS

2001/0051387 A1 * 12/2001 Nakagawa et al. ............. 438/57
2002/0166762 A1 11/2002 Hixson et al.

OTHER PUBLICATIONS

Search Report and Summary of Official Letter dated Apr. 3, 2014, for Taiwanese Patent Application No. 097146652.

* cited by examiner

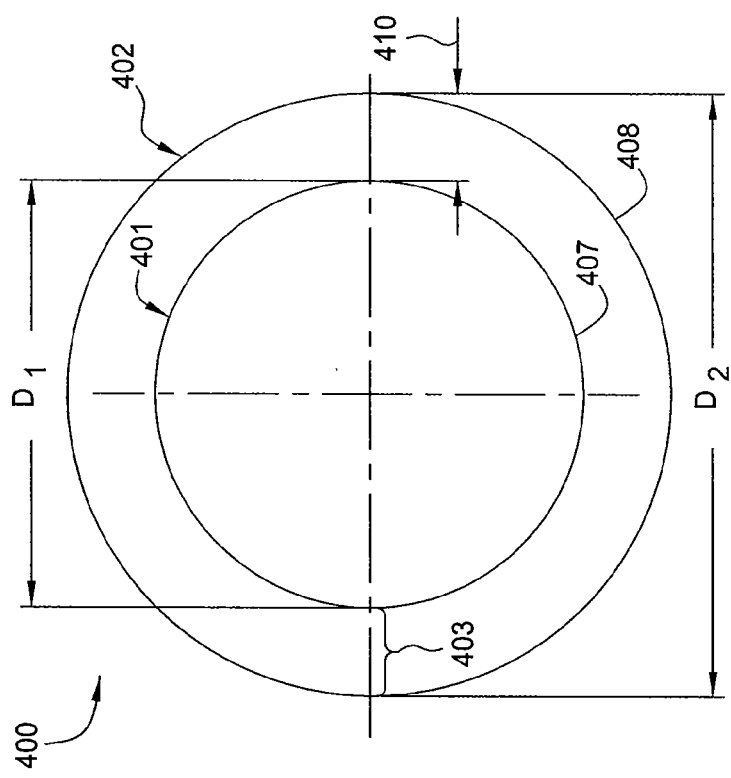
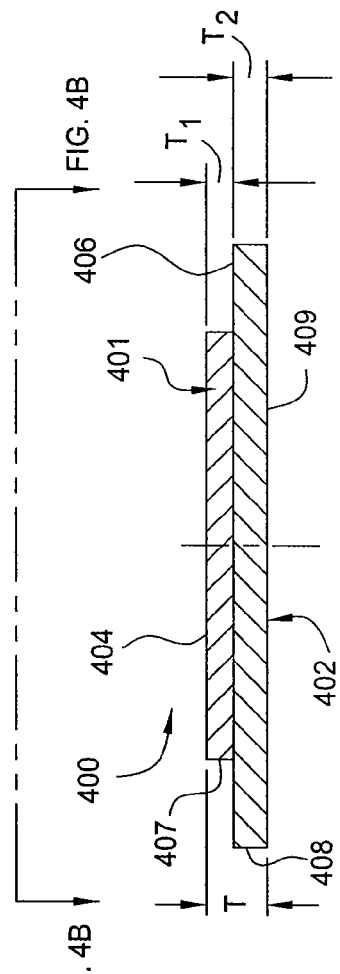
FIG. 4B
FIG. 4A

APPARATUS AND METHOD FOR DEPOSITING ELECTRICALLY CONDUCTIVE PASTING MATERIAL

BACKGROUND OF THE INVENTION

1. Field of the Invention

Embodiments of the present invention generally relate to substrate processing systems and chambers used to process semiconductor wafers, solar panels, and flat panel displays and, in particular, to depositing electrically conductive pasting material in a plasma processing chamber.

2. Description of the Related Art

To help ensure semiconductor device integrity and performance, a semiconductor substrate is often cleaned prior to depositing a film on the substrate to remove contaminants and native oxides which may reside on the substrate surface. Conventional preclean processes typically include a sputter etch process to remove the contaminants and expose the native oxides. The native oxides may then be removed by additional sputter etching and/or reactive etching which uses a reduction reaction.

One example of a native oxide is silicon oxide which tends to form on the surface of a silicon substrate or film. The native silicon oxide layer is a thin layer (e.g., about 30 angstroms thick) that forms when the silicon substrate is exposed to oxygen. Oxygen exposure may occur when moving the substrate between processing chambers at atmospheric conditions, or if oxygen remains in a vacuum processing chamber and contacts the substrate. Prior to a metallization process, it is often desirable to remove the native silicon oxide layer on silicon surfaces in order to lower the contact resistance between the metal layer and underlying silicon material.

Sputter etching is often used to remove the native silicon oxide layer on the surface of a silicon film/substrate before depositing a metal layer which, for example, may be deposited by sputter deposition or chemical vapor deposition. The sputter etching process is typically performed in a vacuum plasma etch chamber. An inert gas, such as argon, is used to form a plasma which may be inductively or capacitively coupled and which ionizes the gas to produce positively charged ions. The substrate rests on a substrate support near the plasma region and the substrate support is coupled to a power supply, such as a radio frequency generator, to bias the substrate support so that the ions are accelerated towards the substrate surface. The ions strike the substrate surface and the impact ejects the silicon oxide from the substrate surface. The ejected or sputtered material is typically exhausted from the vacuum chamber but some may deposit onto the wall surfaces and various components inside the chamber. Since sputter etching is a non-selective, physical process, the sputtered material may include other materials which are located at the substrate surface. In the present example, silicon in addition to silicon oxide may be sputtered and deposited onto the walls of the sputter etch chamber. Other materials may also be deposited on the chamber walls depending on the sputter etch application.

Although most of the sputtered material produced during etching may be exhausted from the sputter etch chamber, the sputtered material which deposits inside the chamber tends to build up over time. As the deposited films grow thicker, stresses may start to build up within the films and these internal stresses can cause the films to delaminate and flake off which may result in particle contamination of the substrate. To prevent such contamination, it is necessary to periodically coat the chamber interior with a material, such as a metal, which acts as a "glue" layer to secure the sputtered material and to provide an adherent surface for additional sputtered material. This process is called "pasting." The layer of pasting material deposited onto the chamber surfaces is usually a low-stress material and forms a barrier to cracking and flaking between the layers of higher-stress material that results during substrate etching.

A sputter etch chamber may be treated with a pasting material by replacing the substrate with a pasting disk which includes the pasting material. For example, if the desired pasting material is aluminum, the pasting disk may be an aluminum plate similar in size and shape to the substrate. The pasting disk may then be placed on the substrate support and sputter etched to produce a sputtered material which consists of aluminum and which coats the interior surfaces of the sputter etch chamber. However, the electrically conductive pasting material may also deposit on various dielectric chamber components and this deposition may affect the dielectric properties of the chamber components and cause a change in the electric field distribution near the substrate during substrate processing. The uniformity of sputter etching across the surface of the substrate is determined in part by the electric field distribution along the substrate surface and so the process of depositing conductive pasting material may result in an undesirable shift in the etching process.

Therefore, a need exists for an improved method and apparatus for depositing an electrically conductive pasting material which does not adversely affect substrate processing and also reduces substrate particle contamination.

SUMMARY OF THE INVENTION

The present invention generally provides improved methods and apparatus for depositing pasting material in a plasma processing chamber. The plasma processing chamber may be adapted for substrate etching, cleaning, or other types of substrate processing.

One embodiment provides a pasting apparatus for the deposition of pasting material in a plasma processing chamber. The apparatus generally includes a pasting disk for use in a plasma processing chamber, and the pasting disk comprises a disk-shaped base of high resistivity material with a pasting material layer applied to the top surface of the base such that the pasting material layer partially covers the top surface of the base, so that an edge exclusion zone is formed on the base which is free of pasting material.

Another embodiment provides a plasma processing chamber configured for deposition of a pasting material. The chamber is a vacuum chamber which encloses a processing volume and includes a substrate support having a pedestal, and a pasting disk disposed on the pedestal. The pasting disk is a disk-shaped base made of a high resistivity material with a pasting material layer applied to the top surface of the base such that the pasting material layer partially covers the top surface of the base, so that an edge exclusion zone is formed on the base which is free of pasting material.

A method for depositing pasting material in a plasma processing chamber according to an embodiment includes the steps of providing a pasting disk having a pasting material layer and a base, wherein the layer diameter is selected to be less than the base diameter to reduce pasting material deposition onto a dielectric edge ring while providing pasting coverage on desired chamber surfaces, transferring the pasting disk from a pasting disk handling device to a substrate support pedestal, positioning the pedestal into a processing position, sputter etching the pasting material layer to deposit pasting material onto processing chamber surfaces, positioning the pedestal to a transfer position, and transferring the pasting disk from the substrate support pedestal to the pasting disk handling device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4A is a cross sectional view of a pasting disk according to one embodiment of the invention.

FIG. 4B is a top view of the pasting disk shown in FIG. 4A according to one embodiment of the invention

To facilitate understanding, identical reference numerals have been used, where possible, to designate identical elements that are common to the figures. It is contemplated that features of one embodiment may be incorporated in other embodiments without further recitation.

DETAILED DESCRIPTION

Embodiments of the invention described herein generally provide a method and apparatus for reducing particle contamination in a plasma processing chamber. In particular, a pasting apparatus and process are provided for depositing electrically conductive pasting material on surfaces and components of a sputter etch processing chamber without adversely affecting substrate processing following the pasting process.

Figure 1:
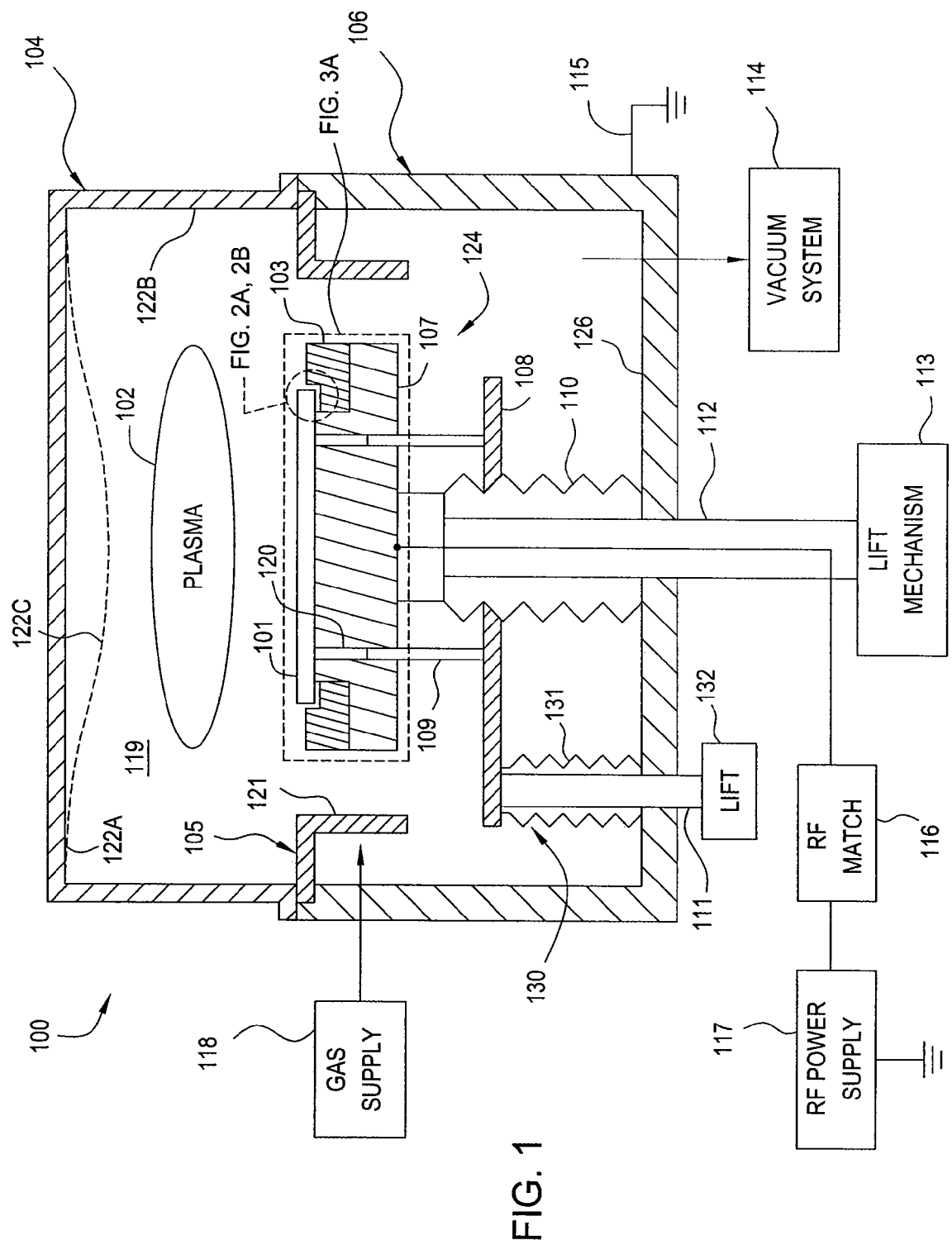
FIG. 1 is a cross-sectional schematic view of a sputter etch process chamber which may be used to practice the invention according to one embodiment of the invention.

FIG. 1 is a cross-sectional schematic view of a sputter etch process chamber which may be used to practice the invention according to one embodiment of the invention. In another embodiment, other types of plasma processing chambers may be used to practice the present invention. A chamber 100 includes a chamber body 106 covered by a dome 104 with top interior surface 122A and sidewall interior surfaces 122B which enclose a processing volume 119. In another embodiment, the dome 104 may be designed to have a top interior surface 122C so that a central portion of the dome 104 is closer to a substrate 101 so that the etch rate near the center of the substrate 101 may be reduced. The chamber 100 may also include one or more deposition shields 105 with walls 121 circumscribing various chamber components to prevent unwanted reaction between such components and ionized process material. Dome shields (not shown) may also be located near dome 104 to prevent deposition of sputtered material onto top interior surface 122A and sidewall interior surfaces 122B. The chamber body 106 and dome 104 may be made of metal, such as aluminum. The chamber 100 is a vacuum chamber and is suitably adapted to maintain sub-atmospheric pressures during substrate processing.

Within the processing volume 119 is disposed a substrate support 124 for supporting the substrate 101 which may be a semiconductor wafer. The substrate support 124 further comprises a pedestal 107 upon which the substrate 101 rests and a support shaft 112 which is coupled to a lift mechanism 113 which provides vertical movement of the substrate support 124 between an upper, processing position (as shown in FIG. 1) and a lower, transfer position (not shown). A bellows assembly 110 is coupled between the substrate support 124 and chamber bottom 126 to provide a flexible seal that allows vertical motion of the substrate support 124 while preventing loss of vacuum from within the etch chamber 100. A substrate lift 130 includes lift pins 109 mounted on a platform 108 connected to a shaft 111 which is coupled to a second lift mechanism 132 for raising and lowering the substrate lift 130 so that the substrate 101 may be placed on or removed from the pedestal 107. The pedestal includes thru-holes 120 to receive the lift pins 109. A bellows assembly 131 is coupled between the substrate lift 130 and chamber bottom 126 to provide a flexible seal which maintains chamber vacuum during vertical motion of the substrate lift 130.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a gas supply 118 which may supply one or more process gasses, such as argon, to the etch chamber 100 for etch processing.

To create the desired plasma for sputter etching the substrate 101, the pedestal 107 is coupled to a radio frequency (RF) match 116 and RF power supply 117. The pedestal 107 may include electrodes (not shown) disposed near the substrate support surface and these electrodes may be coupled to one or more RF matches 116 and one or more RF power supplies 117. The pedestal 107 functions as an RF cathode which is electrically isolated from the chamber body 106 and dome 104 which are connected to a ground 115. Process gas, such as argon, is introduced into the etch chamber 100 from gas supply 118 and the gas pressure is adjusted to a preset value for plasma ignition. A plasma 102 is ignited in the processing volume 119 through capacitive coupling when RF power is delivered to the pedestal 107. The RF match 116 may be adjusted or preset to improve the efficiency of power transfer from the RF power supply 117 to the plasma 102. In addition to providing a plasma source, the RF power supply 117 also applies a bias to the pedestal 107 so that positively charged ions in the plasma 102 are accelerated to the surface of the substrate 101 and the substrate surface is sputter etched.

The RF power supply 117 may provide power at a frequency of 13.56 MHz, but other frequencies may also be used. In one embodiment, two RF frequencies may be used to drive the pedestal 107. A lower frequency may be used to drive the bias and thereby the ion energy and a higher frequency may be used to drive plasma creation and plasma energy.

The etch uniformity at the substrate 101 surface may depend in part on the chamber 100 pressure during processing which is preferably maintained between about 0.5 milliTorr and about 100 milliTorr. The pressure may be controlled by adjusting the vacuum system 114. As previously noted, etch uniformity is also determined in part by the electric field distribution near the substrate surface. If the electric field in nonuniform along the substrate surface, the etch rate will also tend to be nonuniform along the substrate surface. Nonuniformity of the electric field may be especially pronounced near the edges of the substrate since electric charges tend to concentrate along sharp edges or radii and this may cause higher etch rates near the edges of the substrate. To help mitigate this "edge effect", an edge ring 103 made of dielectric material is disposed on the pedestal 107 so that the edge ring 103 surrounds the edges of the substrate 101. The edge ring 103 may block some of the ion flux during sputter etching and also help produce a more uniform electric field near the edge of the substrate 101. The edge ring 103 may be made of quartz, aluminum oxide, or other dielectric materials.

Figure 2A:
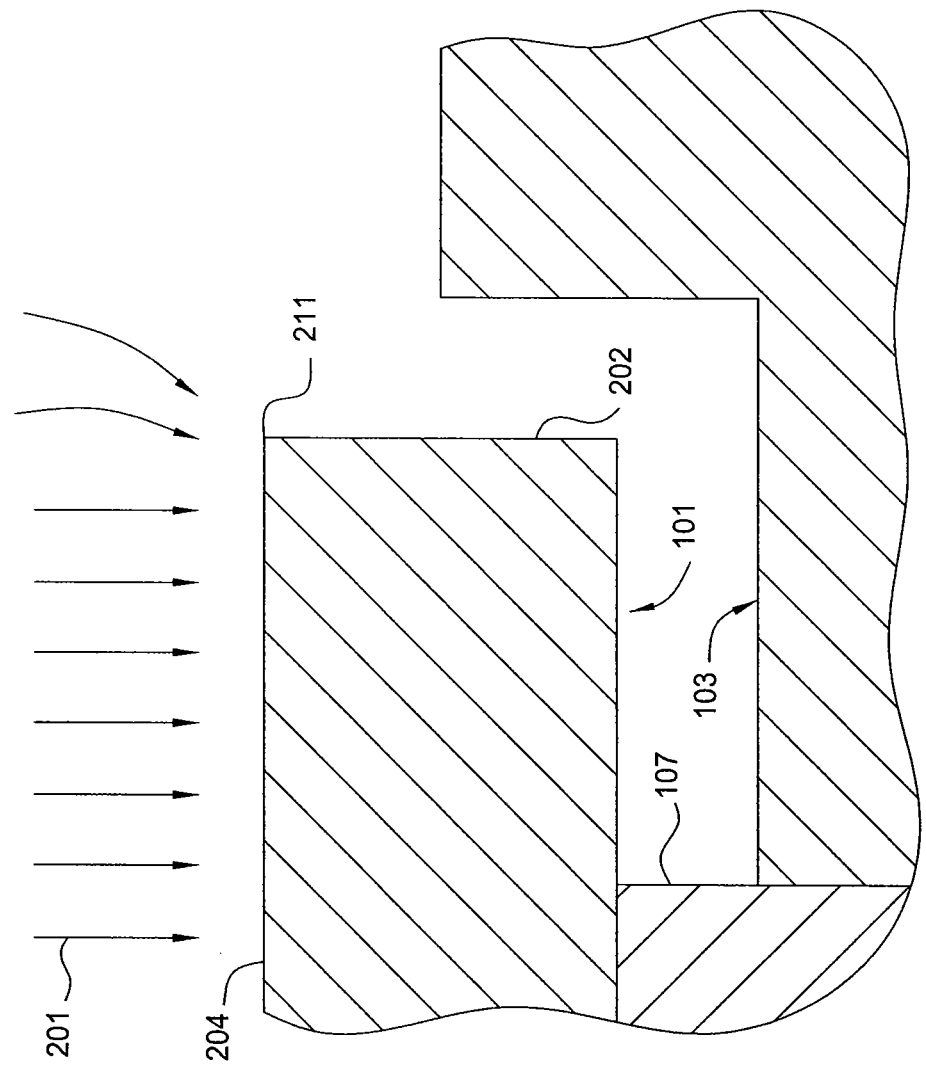
FIG. 2A is a detailed cross sectional view of the substrate and edge ring shown in FIG. 1 when a bias is applied to the substrate.

FIG. 2A is a detailed cross sectional view of the substrate 101 and the edge ring 103 shown in FIG. 1 when a bias is applied to the substrate 101 by means of the biased pedestal 107. An electric field (E field) is represented by electric field lines 201 which are shown near the top surface 204 of the substrate 101 for a moment in time as a time-varying bias is provided to the pedestal 107 by the RF power supply 117. In another embodiment, the bias may be provided by a DC power supply. The electric field as represented by electric field lines 201 may be fairly uniform over the substrate top surface 204 of the substrate due to a fairly uniform charge distribution across the planar surface area of the substrate top surface 204. Such uniformity tends to produce parallel electric field lines 201 which are approximately perpendicular to the substrate top surface 204. However, at the substrate edge 202 the surface area greatly decreases and the charge concentration may increase causing the electric field lines 201 to converge near the substrate edge 202. The convergence of the electric field lines 201 may be especially pronounced near a corner 211. Although the substrate edge 202 may actually be rounded (and have no corner), the electric field lines 201 may also converge along a surface having a small radius. The placement of the edge ring 103 near the substrate edge 202 may limit or minimize the electric field line 201 convergence at the substrate edge 202 but may not entirely eliminate this "edge effect" of the electric field lines 201, as shown in FIG. 2A.

Figure 2B:
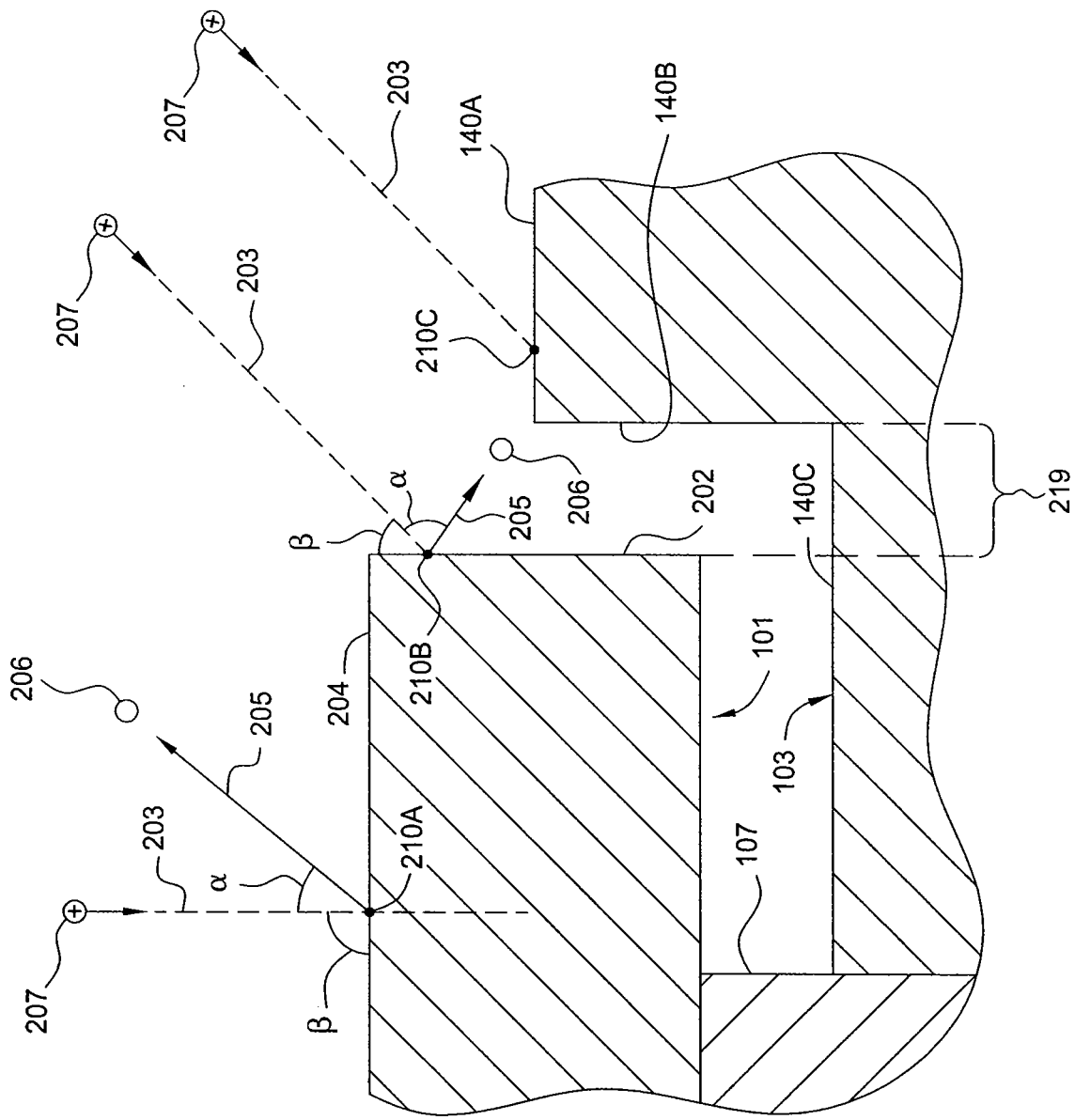
FIG. 2B is a detailed cross sectional view of the substrate and edge ring shown in FIG. 1 during a sputter etch process.

FIG. 2B is a detailed cross sectional view of the substrate and dielectric ring shown in FIG. 1 during a sputter etch process. Positively charged ions 207, such as argon ions, for example, are provided by plasma 102. The biased substrate 101 has electric field lines 201 near the substrate top surface 204 and substrate edge 202 (see FIG. 2A). The positively charged ions 207 are accelerated by the electric field and move in the direction of the electric field lines 201. Away from the substrate edge 202, the electric field may be fairly uniform and the positively charged ions 207 are accelerated towards the substrate top surface 204 in a direction approximately perpendicular to the substrate top surface 204. For example, a positively charged ion 207 moves along an impact trajectory line 203 which is tangent to an electric field line 201 near the substrate top surface 204 (impact surface). The positively charged ion 207 impacts with substrate 101 at a top surface 204 at impact point 210A with an impact angle $\beta$ which may be defined as the angle between the impact surface and impact trajectory line 203. In this example, the impact angle $\beta$ is away from substrate edge 202 and may be approximately 90 degrees. The force of impact ejects or sputters material from the substrate top surface 204 as indicated by sputtered material 206 which is ejected along an ejection trajectory 205. An ejection angle $\alpha$ is defined as the angle between the impact trajectory line 203 and the ejection trajectory 205 near the impact surface. The ejection or removal of material due to ion impact is called sputter etching. The material removal rate or etch rate may depend on many parameters, such as the mass of the positively charged ion 207, the ion density of the plasma 102, and the strength of the electric field, to name a few. The ejection trajectory 205 may be approximated as a straight line or line-of-sight trajectory since the ejected material is typically un-ionized and not affected by the electric field. The trajectories of the sputtered material 206 may change directions following collisions with gas atoms/molecules or ions, but between collisions the trajectories may approximate straight lines.

Near the substrate edge 202, some of the electric field lines 201 may converge and so some positively charged ions 207 may be accelerated towards and impact with the substrate edge 202, as shown in FIG. 2B at impact point 210B. The impact angle $\beta$ may typically be less than 90 degrees but the ejection angle $\alpha$ may have a wide range of values which can cause sputtered material 206 to deposit on nearby surfaces, such as top surface 140A, side-wall surface 140B, and lower surface 140C of the edge ring 103. The surfaces that may receive the most deposition are those which can intercept ejection trajectories 205 from one or more possible ion impact points. Deposition may also occur from sputtered material 206 which bounces off multiple chamber surfaces before depositing on a surface, but sputtered material 206 which does not bounce off of any intervening surfaces and follows direct, straight line or line-of-sight trajectories to a receiving surface may contribute the most to deposition on the receiving surface. However, the extent of deposition also depends on the stickiness of the sputtered material 206 to the receiving surface as well as the exhaust routing of the chamber vacuum system 114 which may remove some of the sputtered material before it can deposit on a surface.

The edge ring 103 may also prevent some ions from striking surfaces of the substrate 101 by blocking ions moving along trajectories that are not perpendicular to substrate top surface 204 and are directed towards substrate edge 202. Referring to FIG. 2B, positively charged ions 207 impact the top surface 140A of the edge ring 103 at impact point 210C. A gap 219 may exist between substrate 101 and edge ring 103. As may be appreciated, by narrowing the gap 219 and/or raising the top surface 140A relative to substrate top surface 204, the edge ring 103 may block more ions and thereby prevent more sputtered material 206 from depositing on surfaces of the edge ring 103.

As previously mentioned, sputter etching is often used to remove the native silicon oxide on a substrate surface. The sputtered material 206 in this application is primarily silicon oxide but may also include some silicon, and these materials may deposit on various surfaces of the chamber 100 such as top and sidewall interior surfaces 122A, 122B and the surfaces previously mentioned for edge ring 103. Depending on the sputter etch application, other materials may also be deposited on the chamber surfaces.

To prevent the sputtered material 206 from causing possible particle contamination of the substrate 101, the chamber 100 may be periodically treated using a pasting process which coats interior surfaces of the chamber 100 with a pasting material. The pasting material is preferably chosen so that the material adheres well to the components and surfaces inside the chamber 100, otherwise the pasting material itself may be a source of particle contamination. Additionally, the pasting material is preferably chosen so that the material has low internal stress and adheres well to the sputtered material 206, acts as an adherent layer for additional sputtered material 206, and prevents delamination and flaking of previously deposited sputtered material 206.

Metallic pasting materials may be desirable in some pasting applications since some metals are highly ductile and malleable and tend to have low internal stresses. Additionally, many chamber components and surfaces are often made of metal and so may provide good adhesion for various types of metallic pasting materials. The metallic pasting material may be selected based on the desired properties of the pasting material, such as good adhesion to materials which comprise the surfaces to be coated, and an ability to form pasting material layers which resist delamination and flaking. As mentioned, the latter property may be provided by a metallic pasting material that is highly ductile or malleable and produces pasting material layers with low internal stresses.

Figure 3A:
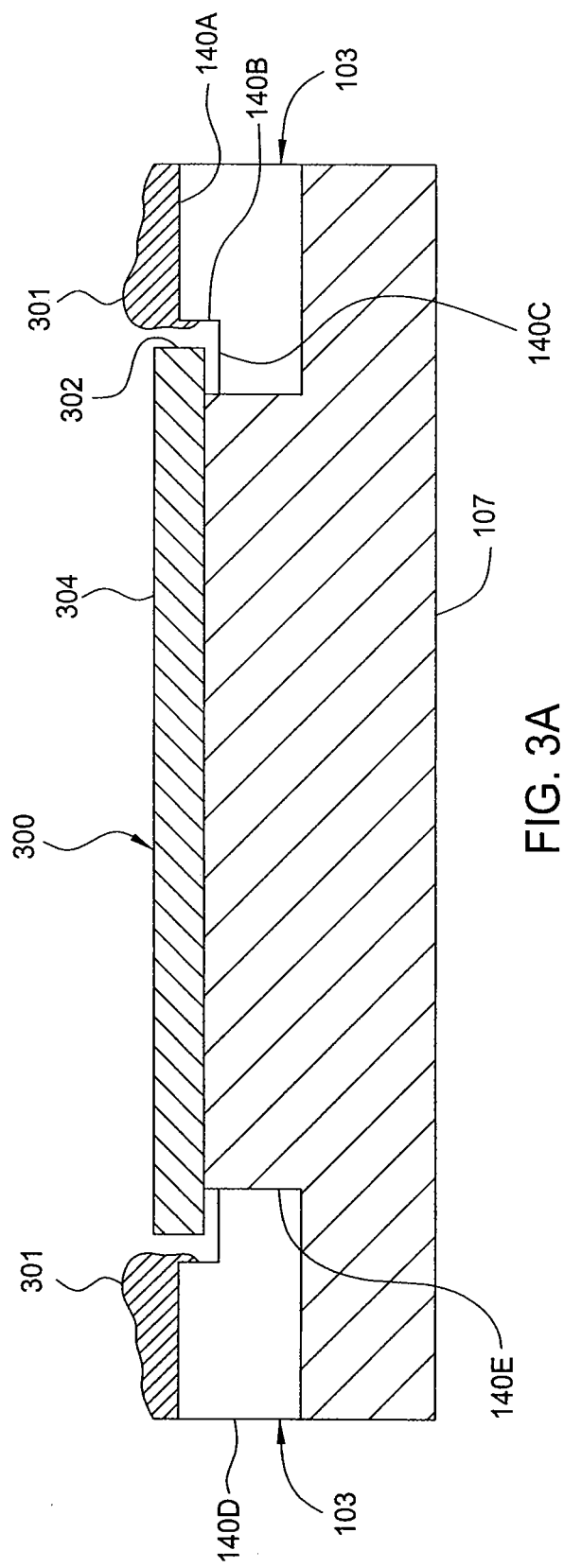
FIG. 3A is a detailed cross sectional view of the pedestal and edge ring shown in FIG. 1 following a pasting process.

FIG. 3A is a detailed cross sectional view of the pedestal 107 and edge ring 103 shown in FIG. 1 following a pasting process. The substrate 101 has been replaced with a pasting disk 300 used for pasting metallic material onto interior surfaces of the chamber 100. The pasting disk 300 may comprise a metal plate which has approximately the same size and shape as the substrate 101 so that the metallic pasting disk 300 may be transferred to and from chamber 100 using a substrate handling robot. The pasting disk 300 may comprise one or more metals and/or metal alloys which are desired for the pasting application.

To deposit the metal pasting material onto the interior surfaces of the chamber 100, the pasting disk 300 is sputter etched and sputtered material 206 is ejected from a pasting disk top surface 304 and other exposed surfaces of the pasting disk 300 in a similar way as described for substrate 101 and depicted in FIG. 2B. However, the electrically conductive pasting disk 300 may have greater charge concentrations near a pasting disk edge 302 as compared to the charge concentrations at substrate edge 202 during the sputter etch process, and so there may be a greater tendency for electric field lines 201 to converge at the pasting disk edge 302, and this may increase the sputter etch rate and, thus, the deposition rate of sputtered material 206 onto surfaces near the pasting disk edge 302.

Referring to FIG. 3A, the sputtered material 206 may form metal deposits 301 on one or more surfaces of the edge ring 103, and the metal deposits 301 can build up over time after repeated pasting treatments of chamber 100. The metal deposits 301 may form on top surface 140A, side-wall surface 140B, and lower surface 140C of the edge ring 103. The lower surface 140C may receive fewer metal deposits 301 since this surface may not be as exposed to sputtered material 206 as the top surface 140A and side-wall surface 140B of edge ring 103. An outer surface 140D and an inner surface 140E of edge ring 103 may receive little if any sputtered material 206 since these surfaces are not exposed to line-of-sight trajectories for material ejected from pasting disk 300.

Figure 3B:
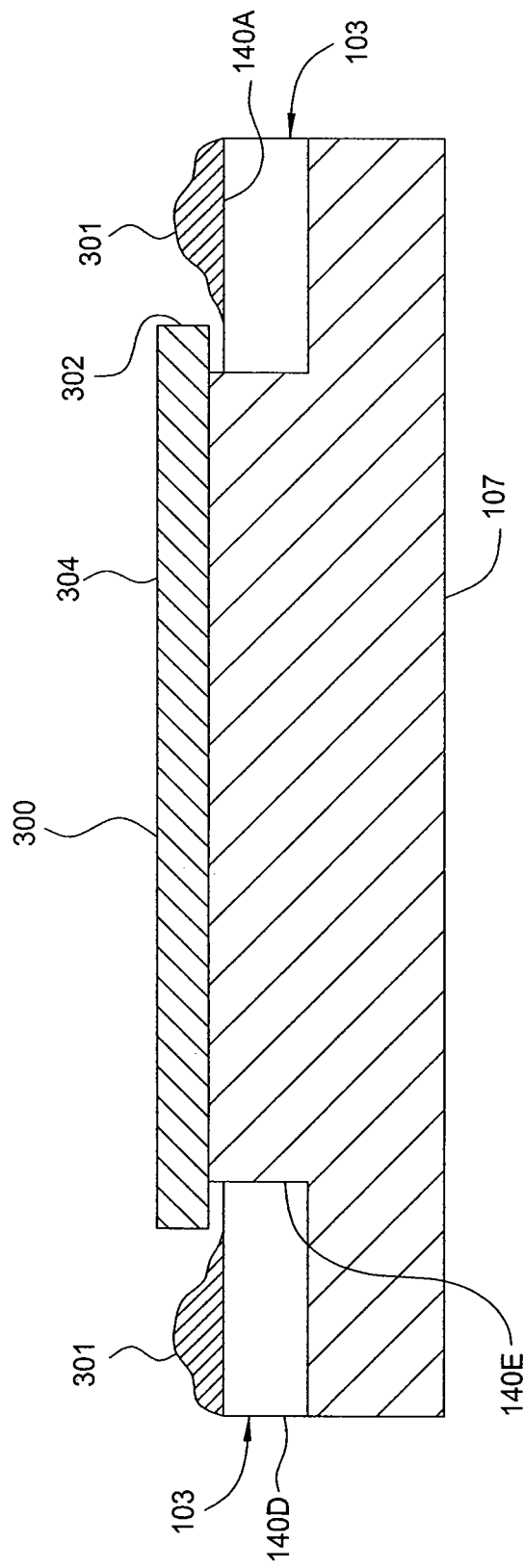
FIG. 3B is a detailed cross sectional view of another embodiment of the pedestal and edge ring shown in FIG. 3A following a pasting process.

FIG. 3B is a detailed cross sectional view of another embodiment of the pedestal and edge ring shown in FIG. 3A as configured for a pasting process. The edge ring 103 which is disposed around the periphery of pedestal 107 may have different shapes, as indicated by the rectangular cross section shown in FIG. 3B, but one or more surfaces of the edge ring 103 will generally be exposed to sputtered material 206 which may form metal deposits 301 on said surfaces, such as top surface 140A.

The presence of metal deposits 301 on edge ring 103 will tend to alter the electric field distribution near substrate edge 202 since the surface conductivity of the edge ring 103 is altered by the metal deposits 301. Additionally, the metal deposits 301 may change shape and extent following each pasting treatment of chamber 100 and this can produce unpredictable changes in the electric field distribution near substrate edge 202. To avoid undesirable shifts in the sputter etch process, it is therefore desirable to minimize the deposition of electrically conductive material onto the edge ring 103.

FIG. 4A is a cross sectional view of a pasting disk according to one embodiment of the invention. The pasting disk 400 is a composite disk of more than one material. The pasting disk 400 comprises a base 402 and a pasting material layer 401 which is applied to a top surface 406 of the base 402. The pasting material layer 401 comprises a pasting material which is electrically conductive. In another embodiment, the pasting material may be non-conductive or electrically insulative. The pasting material layer 401 may be applied by masking the base 402 and depositing the pasting material using a suitable deposition process, such as arc spraying, sputtering, or other deposition methods which may coat the base 402 with a pasting material layer 401. In another embodiment, the pasting material layer 401 may comprise a thin sheet or disk of pasting material which is applied to the base 402 using a suitable bonding process.

The pasting material layer 401 has a layer top surface 404 which is sputter etched during a pasting process. The pasting material layer 401 has a layer thickness $T_1$ measured from layer top surface 404 to base top surface 406, and the base 402 has a base thickness $T_2$ measured from base top surface 406 to base bottom surface 409. The layer thickness $T_1$ may range from about 1 micron (μm) to about 100 microns (μm), and the base thickness $T_2$ may range from about 0.5 millimeters (mm) to about 5 millimeters (mm), but other thickness values may also be used. The pasting disk 400 has an overall thickness T which is approximately the sum of the individual layer and base thicknesses $T_1$ and $T_2$.

FIG. 4B is a top view of the pasting disk 400 shown in FIG. 4A according to one embodiment of the invention. The pasting material layer 401 has a layer diameter $D_1$ measured to a layer edge surface 407, and the base 402 has base diameter $D_2$ measured to a base edge surface 408. The pasting material layer 401 is applied so that an edge exclusion zone 403 having edge exclusion width 410 is produced which is free of the pasting material. The base diameter $D_2$ is approximately equal to the sum of the layer diameter $D_1$ plus twice the edge exclusion width 410. The layer diameter $D_1$ is less than the base diameter $D_2$, and the layer to base diameter ratio $D_1/D_2$ may range from about 0.4 to about 0.98. In another embodiment, the diameter ratio $D_1/D_2$ may range from about 0.7 to about 0.98. The base diameter $D_2$ of the pasting disk 400 may range from about 200 mm to about 300 mm. In another embodiment, the base diameter $D_2$ may exceed 300 mm. In yet another embodiment, the pasting "disk" 400 may comprise a pasting material layer 401 and base 402 which have other shapes, such as oval, square, rectangular, or other shapes, and different shapes may be combined, such as a square pasting material layer 401 on a circular or disk-shaped base 402, for example.

The base 402 may be made of a dielectric or high resistivity material such as quartz, aluminum oxide ($Al_2O_3$), silicon (e.g., intrinsic silicon), silicon oxide (e.g., $SiO_2$), ceramic or other suitable high resistivity materials. The pasting material used for pasting material layer 401 may vary depending on the desired pasting application. In one embodiment, the pasting material layer 401 comprises one or more metals and/or metal alloys such as aluminum, copper, silver, or gold, for example. In another embodiment, other electrically conductive materials may be used for the pasting material layer 401. In yet another embodiment, the pasting material layer 401 may comprise non-conductive or electrically insulative materials.

Figure 5A:
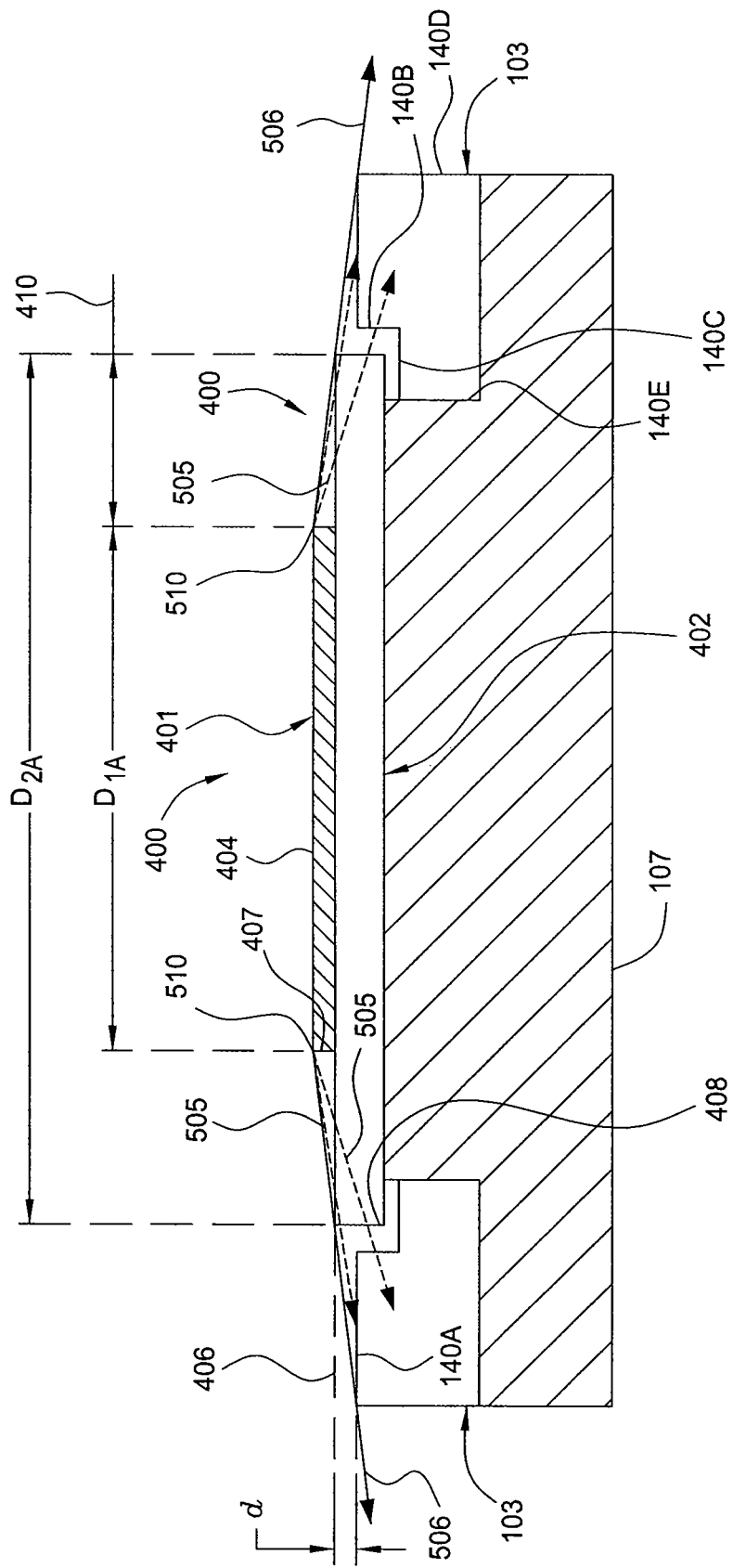
FIG. 5A is a cross sectional view of a pasting disk and edge ring according to one embodiment of the invention.

FIG. 5A is a cross sectional view of a pasting disk 400 and edge ring 103 according to one embodiment of the invention. The pasting disk 400 is disposed on pedestal 107 and the pasting disk 400 is sputter etched during the pasting process. The pasting material layer 401 has a layer diameter $D_{1A}$ and the base 402 has a base diameter $D_{2A}$. Electrically conductive pasting material is sputter etched at layer top surface 404 and may also be sputter etched at layer edge surface 407 of the pasting material layer 401. Likewise, dielectric material may be sputtered from the base 402 at base top surface 406 and base edge surface 408. Positively charged ions 207 impact the pasting material layer 401 at impact points 510 which are located at or near layer edge surface 407 and layer top surface 404. Pasting material is ejected from impact points 510 and travels in line-of-sight trajectories along ejection trajectories 506 (solid arrows) and blocked ejection trajectories 505 (dashed arrows). Pasting material ejected along the blocked ejection trajectories 505 is blocked or intercepted by the base 402 and does not deposit on the edge ring 103. Pasting material ejected along ejection trajectories 506 is not blocked by the base 402 and the pasting material travels past the edge ring 103 without being intercepted by any surfaces of the edge ring 103.

The impact points 510 on pasting material layer 401 represent a locus of points on a circle of layer diameter $D_{1A}$ such that for any ion impact location on the pasting material layer 401, the ejected pasting material will travel along a trajectory which is either intercepted or blocked by base 402 or travels beyond the base 402 without being intercepted by any surfaces of the edge ring 103. In other words, values for the geometrical parameters of the pasting disk 400, such as layer diameter $D_{1A}$, edge exclusion width 410, layer thickness $T_1$, and base thickness $T_2$, may be suitably selected for a specific edge ring 103 geometry so that no sputtered pasting material which follows a straight line or line-of-sight trajectory will be deposited on any surfaces of the edge ring 103. Although some sputtered pasting material may bounce off multiple chamber 100 surfaces and/or scatter off of gas atoms/molecules or ions before depositing on the edge ring 103, the elimination or reduction of deposition from pasting material having straight line or line-of-sight trajectories originating from any point on the surface of pasting material layer 401 may significantly reduce the amount of pasting material which deposits on edge ring 103.

Referring to FIG. 5A, a limit distance d is measured between the top surface 140A of edge ring 103 and the base top surface 406. The limit distance d is the minimum distance needed to prevent ejection trajectories 506 from being intercepted by the top surface 140A of edge ring 103. Since limit distance d references a feature (top surface 140A) of the edge ring 103, it can be appreciated that the choice of values for the geometrical parameters of the pasting disk 400 are selected based, in part, on the locations of various features of the edge ring 103 in order to satisfy the condition that little or no deposition occurs on edge ring 103 for sputtered pasting material which follows line-of-sight trajectories from pasting material layer 401. The geometrical parameters of the pasting disk 400 may be selected to minimize the deposition of pasting material on other chamber components which are located near the substrate processing area, and the edge ring 103 is just one example of such a component.

Depending on the etch application, some electrically conductive pasting material may be deposited on the edge ring 103 without shifting the sputter etch process beyond acceptable limits, and so the range of acceptable values for the geometrical parameters of the pasting disk 400 may be increased. For example, the deposition of limited amounts of conductive material at the top surface 140A near outer surface 140D of edge ring 103 may have minimal effect on the electric field distribution near the substrate edge 202 and so the sputter etch process may remain within acceptable limits for a larger range of values for layer diameter $D_1$.

During sputter etching of pasting disk 400, the base 402 is also sputtered and base material may deposit on the edge ring 103 and other chamber surfaces and components. Since the base material is a dielectric or highly resistive material, deposited base material will tend to leave the dielectric properties of the edge ring 103 and other chamber components unaffected so that there is no undesirable shift in the sputter etch process. However, multiple pasting treatments of chamber 100 may result in a build up of conductive pasting material on the base 402 due to the pasting material which follows blocked ejection trajectories 505 and deposits on the base top surface 406. The build up of conductive pasting material on the base 402 may effectively reduce the edge exclusion width 410 of pasting disk 400 which may cause undesirable deposition of conductive pasting material on edge ring 103 during pasting treatment. The pasting disk 400 may therefore be periodically replaced or cleaned to keep the edge exclusion zone 403 free of pasting material and prevent undesirable deposition of pasting material on edge ring 103. Additionally, the pasting disk 400 may have to be periodically replaced due to the depletion of pasting material after multiple pasting treatments.

Figure 5B:
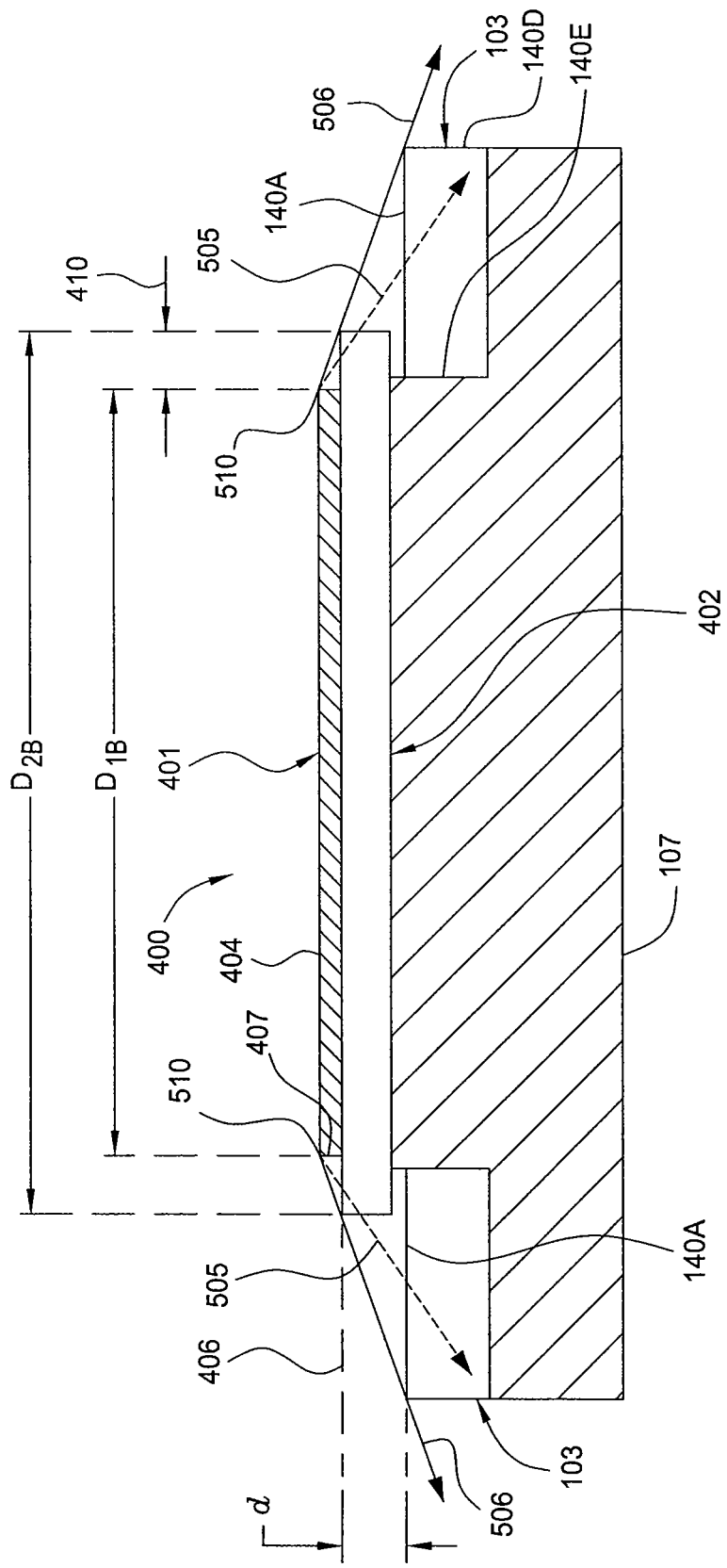
FIG. 5B is a cross sectional view of another embodiment of a pasting disk and edge ring according to the present invention.

FIG. 5B is a cross sectional view of another embodiment of a pasting disk 400 and edge ring 103 according to the present invention. The pasting material layer 401 has a layer diameter $D_{1B}$ and the base 402 has a base diameter $D_{2B}$. The edge ring 103 has a different cross-sectional profile which lowers the top surface 140A relative to the base top surface 406 and limit distance d is increased. For the purpose of comparison, the pedestal 107 dimensions, base diameter $D_{2A}$, and layer and base thicknesses $T_1$, $T_2$ remain unchanged from FIG. 5A, and $D_{2A}=D_{2B}$. Note that the increased limit distance d allows a larger layer diameter $D_{1B}$ (and smaller edge exclusion width 410) so the $D_{1B}/D_{2B}>D_{1A}/D_{2A}$ while still preventing ejection trajectories 506 from being intercepted by the top surface 140A of edge ring 103. As FIGS. 5A and 5B show, the required edge exclusion width 410 necessary to prevent the deposition of sputtered conductive material on edge ring 103 is dependent in part on the locations of various features on the edge ring 103.

Figure 6:
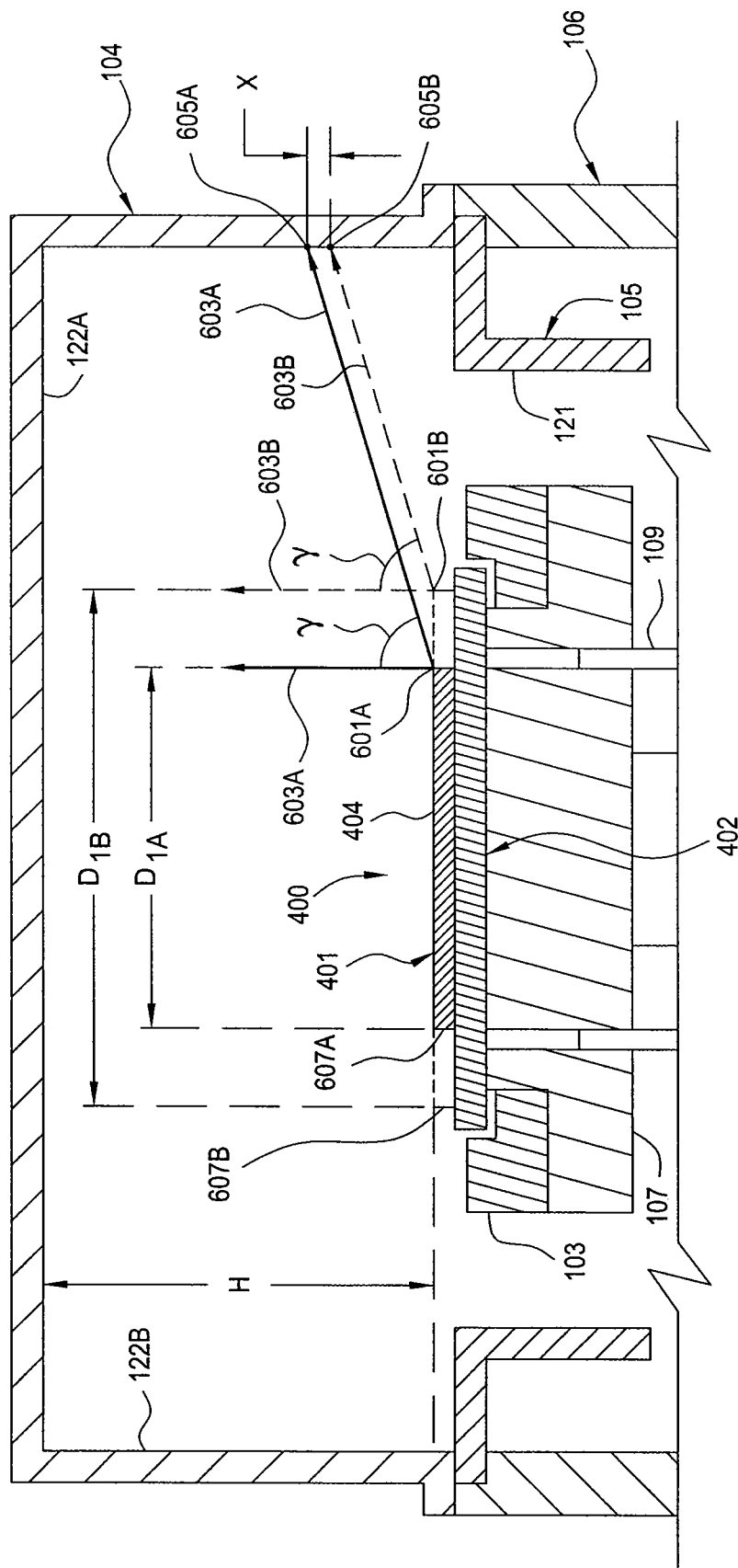
FIG. 6 is a cross sectional schematic view of the upper portion of the chamber shown in FIG. 1 according to one embodiment of the invention.

FIG. 6 is a cross sectional schematic view of the upper portion of the chamber 100 shown in FIG. 1 according to one embodiment of the invention. The pasting disk 400 is disposed on pedestal 107 which is in the processing position. The layer top surface 404 of the pasting material layer 401 is a distance H from top interior surface 122A of dome 104. The pasting material layer 401 has layer diameter $D_{1A}$ measured to edge surface 607A. An impact point 601A may be located at layer top surface 404 and edge surface 607A and receives ions during sputter etching. Conductive material is ejected from impact point 601A through a dispersion angle γ and travels in line-of-sight trajectories along ejection trajectories 603A (solid arrows) and impacts various interior surfaces of chamber 100, such as top interior surface 122A, sidewall interior surface 122B, and walls 121 of deposition shields 105 where the conductive material may deposit during the pasting process. Some of the ejected conductive material may travel along one ejection trajectory 603A and deposit at point 605A on sidewall interior surface 122B of dome 104.

For clarity, only two line-of-sight ejection trajectories 603A are shown for impact point 601A, but many line-of-sight ejection trajectories 603A may be possible for impact point 601A as indicated by dispersion angle γ which represents a range of directions for line-of-sight ejection trajectories 603A. Additionally, dispersion angle γ is only half of a full dispersion angle 2γ which represents a full range of possible directions (in two dimensions) for line-of-sight ejection trajectories 603A about impact point 601A. The full dispersion angle 2γ may range from 0 degrees to 180 degrees or more depending on the location of the ion impact point relative to the edge surface 607A of the pasting material layer 401.

A second impact point 601B is shown in FIG. 6 for the case when pasting material layer 401 has a larger layer diameter $D_{1B}$ measured to edge surface 607B. Conductive material is ejected from impact point 601B through a dispersion angle γ and travels in line-of-sight trajectories along ejection trajectories 603B (dashed arrows). For comparison, the impact point 601B has the same location as 601A relative to pasting material layer 401, and only ejection trajectories 603B parallel to ejection trajectories 603A are shown. Ejected conductive pasting material travels along one ejection trajectory 603B and deposits at point 605B on sidewall interior surface 122B. Note that the increase from layer diameter $D_{1A}$ to layer diameter $D_{1B}$ of pasting material layer 401 lowers the ejection trajectory 603B so that point 605B is below point 605A at sidewall interior surface 122B by a distance X, and so a larger interior surface area of the dome 104 and chamber 100 may be more effectively covered by pasting material during the pasting process by increasing the diameter of the pasting material layer 401 on pasting disk 400.

FIG. 6 also shows that ejection trajectory 603A could be lowered to point 605B by increasing the distance H from layer top surface 404 to top interior surface 122A of dome 104, and so increasing the distance H may also increase the deposition coverage area of pasting material on interior surfaces of the dome 104. However, the distance H is determined in part by the dome 104 geometry and the requirements of plasma 102 proximity to layer top surface 404 during sputter etching, and so the adjustability in the value of distance H during the pasting process may be limited.

Since it is usually desirable to increase the area of pasting coverage for chamber 100 surfaces which are disposed near or over the substrate 101 to reduce the risk of particle contamination, the layer diameter $D_1$ of pasting disk 400 may be selected to have a value which provides a large pasting coverage area while still preventing or minimizing the deposition of pasting material on edge ring 103. To further facilitate the pasting treatment process, the pasting disk 400 may be suitably sized and shaped for transfer to and from chamber 100 using a substrate handling robot (not shown). Additionally, the chamber 100 may be modified so that the pasting disk 400 may remain within the chamber 100 during substrate 101 processing.

Figure 7A:
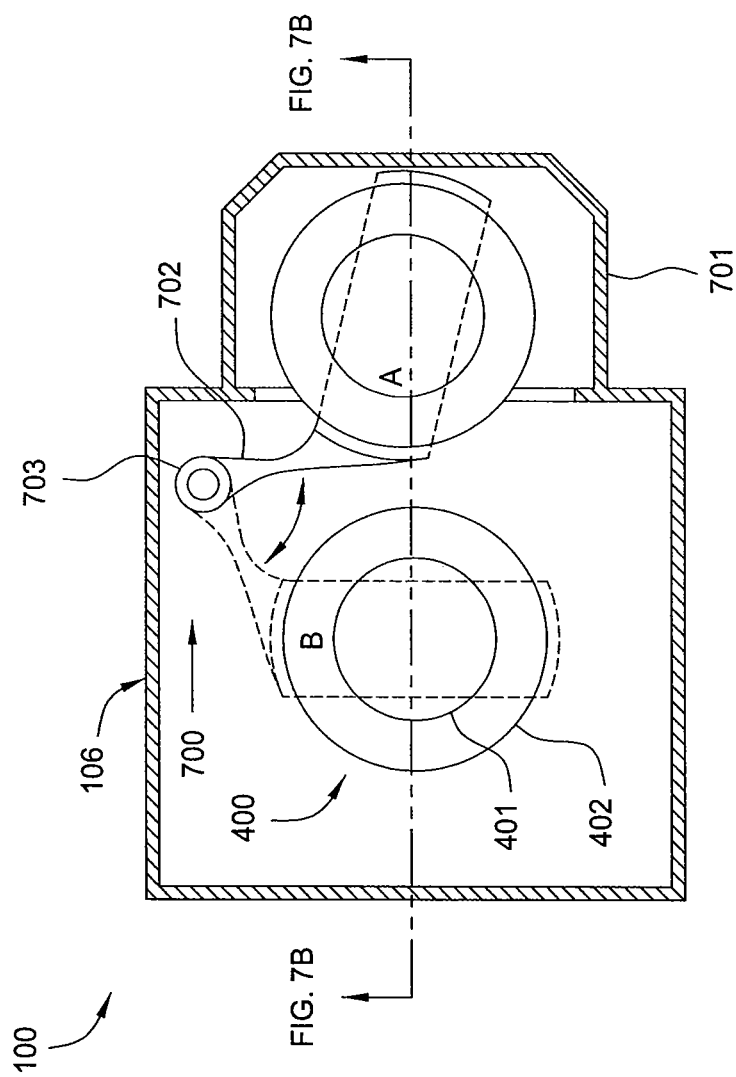
FIG. 7A is a schematic cross sectional top view of another embodiment of the chamber shown in FIG. 1.

FIG. 7A is a schematic cross sectional top view of another embodiment of the chamber shown in FIG. 1. Chamber 100 may be suitably adapted to include a shutter apparatus 700 which includes a shutter arm housing 701, shutter arm 702, and shutter arm shaft 703. The shutter arm housing 701 is coupled to chamber body 106 so that a vacuum seal exists between the shutter arm housing 701 and chamber body 106. The shutter arm 702 is coupled to a shutter arm shaft 703 so that the shutter arm 702 may rotate between housing position A and chamber position B. A rotary actuator (not shown) or other suitable means may be coupled to one end of the shutter arm shaft 703 to cause the shutter arm 702 to rotate between housing position A and chamber position B. The shutter arm 702 is suitably adapted to receive and support pasting disk 400 so that the pasting disk 400 may be transferred to and from lift pins 109 (see FIG. 7B).

Figure 7B:
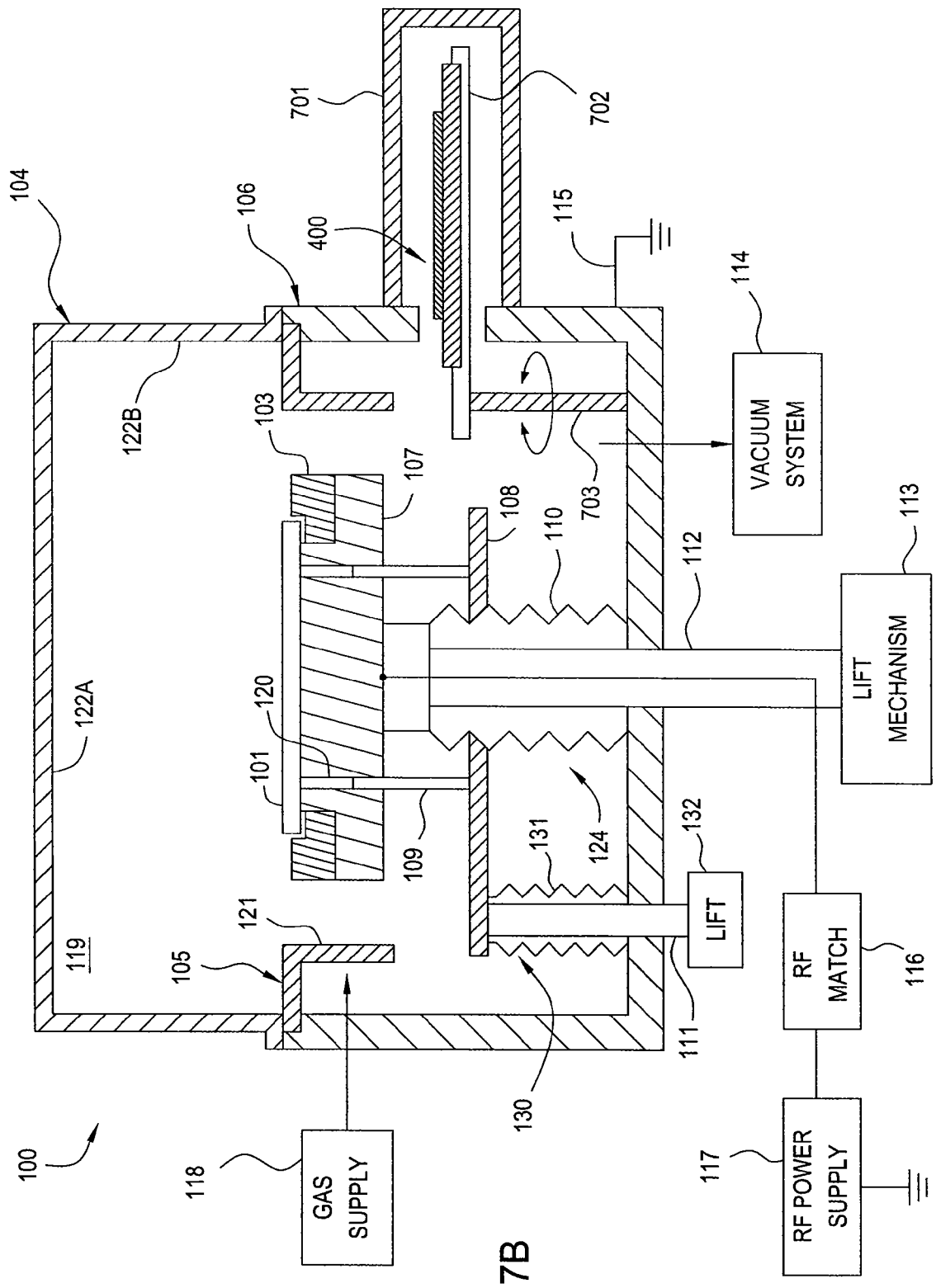
FIG. 7B is a schematic cross sectional view of the chamber shown in FIG. 7A.

FIG. 7B is a schematic cross sectional view of the chamber shown in FIG. 7A. During substrate 101 processing, the shutter arm 702 supports pasting disk 400 at housing position A inside shutter arm housing 701. After substrate 101 processing, the substrate support 124 is lowered by lift mechanism 113 to a transfer position. The substrate lift 130 may then raise platform 108 and lift pin 109 so that lift pins 109 contact the substrate 101 and lift the substrate 101 from pedestal 107 so that a substrate handling robot blade (not shown) may enter chamber 100 and move under the substrate 101. The substrate lift 130 may then lower slightly to an exchange position so that the substrate 101 is transferred from lift pins 109 to the substrate handling robot blade. The substrate handling robot blade can then remove the substrate 101 from chamber 100.

To prepare for a pasting treatment, the shutter arm 702 may then rotate to chamber position B (see FIG. 7A) so that the pasting disk 400 is above lift pins 109. The substrate lift 130 may then raise slightly to an exchange position so that the pasting disk 400 is transferred from shutter arm 702 to lift pins 109. The shutter arm 702 may then rotate back to housing position A, and the substrate lift 130 can then move downwards so that the pasting disk 400 is transferred from lift pins 109 to pedestal 107. After the pasting disk 400 has been transferred to the pedestal 107, the substrate support 124 may move upwards to processing position so that pasting disk 400 is in processing volume 119 and pasting treatment may begin.

After the pasting disk 400 has been sputter etched and the pasting treatment is completed, the pasting disk 400 may be transferred back to the shutter arm 702 by reversing the aforementioned steps. The sequence and manner of steps for transferring pasting disk 400 to and from shutter arm 702 and pedestal 107 and described herein are not meant to be limiting, and other embodiments for said steps may be contemplated for the present invention.

Figure 7C:
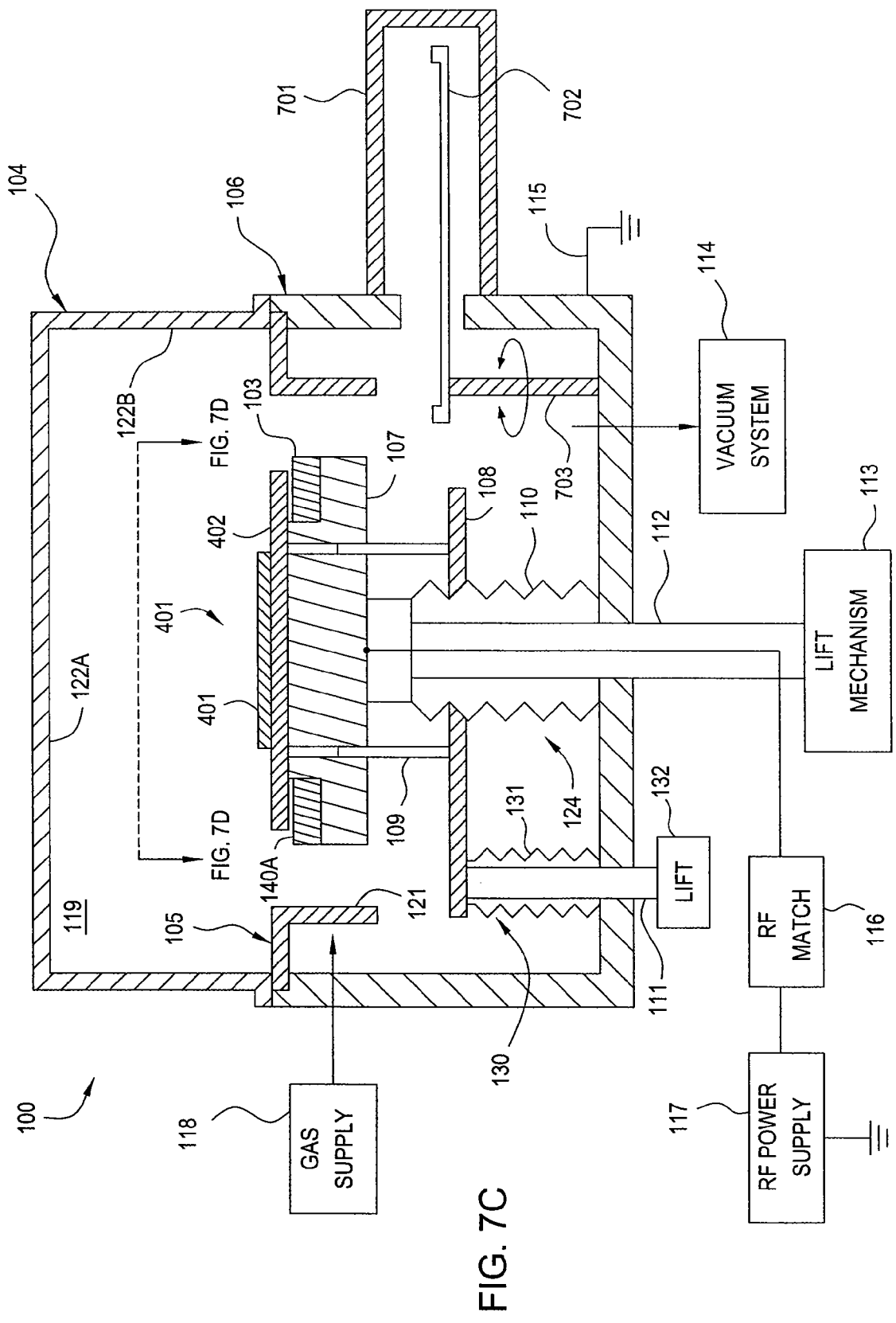
FIG. 7C is a schematic cross sectional view of another embodiment of the chamber shown in FIG. 7B.

FIG. 7C is a schematic cross sectional view of another embodiment of the chamber shown in FIG. 7B. In addition to not having to remove the pasting disk 400 from the chamber 100, the shutter apparatus 700 has an additional advantage of allowing the use of a pasting disk 400 that is larger in diameter than substrate 101 which is transferred by a substrate handling robot. The shutter arm 702 may be suitably adapted to support and transfer a pasting disk 400 which has a base diameter $D_2$ which is larger than the diameter of the substrate 101. The location of top surface 140A of the edge ring 103 may also be adapted so that the pasting disk 400 may rest on pedestal 107 without interfering with the edge ring 103, as shown in FIG. 7C. The base diameter $D_2$ may be sized to exceed the diameter of the substrate 101 so that all or at least part of the top surface 140A of the edge ring 103 is covered by the base 402 during the pasting process to prevent or minimize deposition of pasting material onto the edge ring 103. It is to be understood that top surface 140A may comprise one or more surfaces of the edge ring 103 which generally face the processing region 119.

Figure 7D:
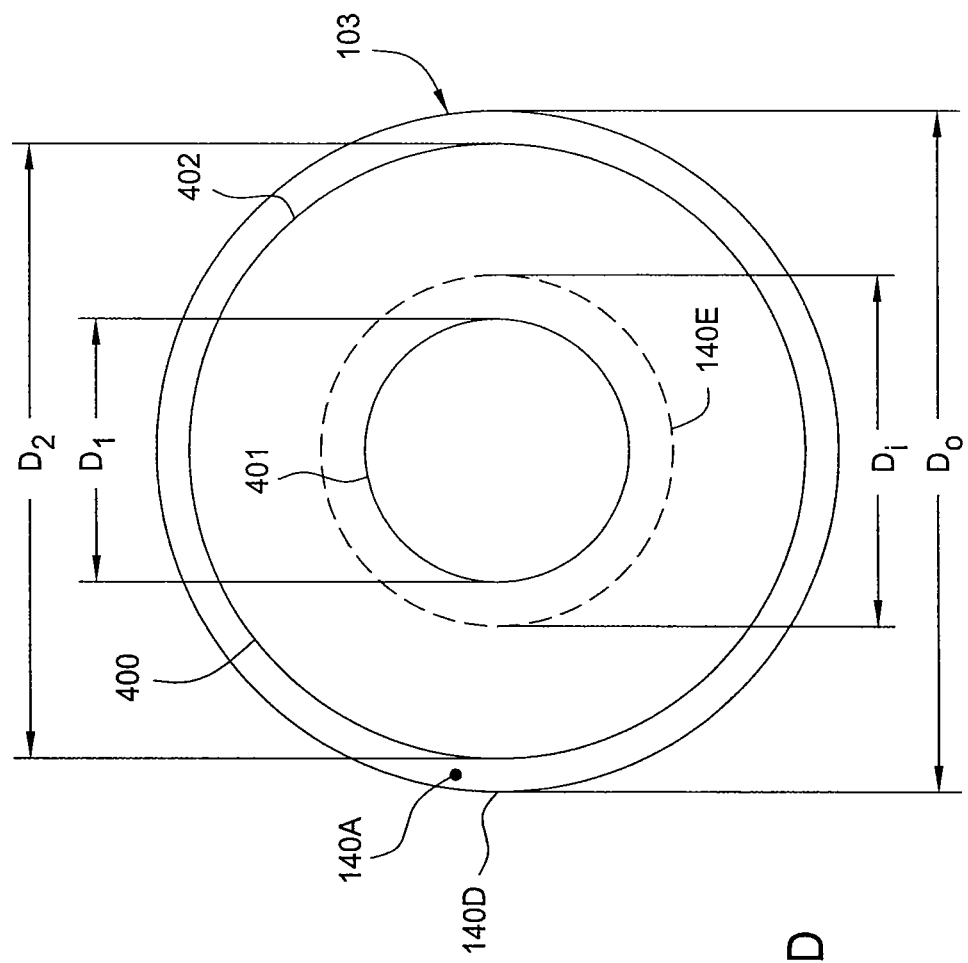
FIG. 7D is a schematic top view of the edge ring and pasting disk shown in FIG. 7C.

FIG. 7D is a schematic top view of the dielectric ring and pasting disk shown in FIG. 7C. The edge ring 103 has edge ring inner diameter $D_1$ measured to inner surface 140E (dashed line) and edge ring outer diameter $D_o$ measured to outer surface 140D. The pasting disk 400 has base diameter $D_2$ and layer diameter $D_1$, and the base 402 covers part of the edge ring 103 top surface 140A. In another embodiment, base diameter $D_2$ is approximately equal to edge ring outer diameter $D_o$ and the base 402 completely covers the edge ring 103.

While the foregoing is directed to embodiments of the present invention, other and further embodiments of the invention may be devised without departing from the basic scope thereof, and the scope thereof is determined by the claims that follow.

The invention claimed is:

1. A pasting disk for use in a plasma processing chamber, comprising:
   a pasting disk configured to be disposed in a plasma processing chamber while performing an interior chamber component pasting process in the plasma processing chamber comprising:
   a disk-shaped base comprising a high resistivity material and having a top surface; and
   a pasting material layer having a continuous surface continuously disposed on the top surface, wherein a ratio of a diameter of the pasting material layer to a diameter of the disk-shaped base ranges from about 0.4 to about 0.7, and wherein the base and pasting material layer together form a pasting disk sized for transporting to and from the plasma processing chamber with a substrate handling robot.

2. The pasting disk of claim 1, wherein the pasting material layer is applied using a deposition process.

3. The pasting disk of claim 2, wherein the deposition process is arc spraying.

4. The pasting disk of claim 1, wherein the pasting material layer comprises an electrically conductive material.

5. The pasting disk of claim 4, wherein the electrically conductive material is a metal or metal alloy.

6. The pasting disk of claim 5, wherein the metal or metal alloy is aluminum.

7. The pasting disk of claim 1, wherein the high resistivity material is selected from the group consisting of aluminum oxide, quartz, silicon, and silicon oxide.

8. The pasting disk of claim 1, wherein the thickness of the pasting material layer ranges from about 1 micron to about 100 microns.

9. A plasma processing chamber, comprising:
   a vacuum chamber which encloses a processing volume;
   a substrate support having a pedestal for supporting a production substrate or a pasting disk; and the pasting disk movably disposed within the vacuum while performing an interior chamber component pasting process in the plasma processing chamber comprising:
   a disk-shaped base comprising a high resistivity material and having a top surface; and
   a pasting material layer having a continuous surface continuously formed to the top surface, wherein a ratio of a diameter of the pasting material layer to a diameter of the disk-shaped base ranges from about 0.4 to about 0.7, and wherein the pasting disk is sized for transporting to and from the vacuum chamber with a substrate handling robot.

10. The plasma processing chamber of claim 9, wherein the plasma processing chamber is a sputter etch processing chamber.

11. The plasma processing chamber of claim 9, further comprising a shutter apparatus for supporting the pasting disk and for transferring the pasting disk between a shutter arm housing and the pedestal, whereby the pasting disk may remain within the plasma processing chamber during and after substrate processing.

12. The plasma processing chamber of claim 9, wherein the plasma processing chamber is a capacitively coupled plasma processing chamber.

13. The plasma processing chamber of claim 9, further comprising a dielectric edge ring and a dome, wherein the dome encloses the processing volume and said dome is made of metal.

14. The plasma processing chamber of claim 9, wherein the pasting material layer is disk-shaped and has a diameter less than a diameter of the disk-shaped base.

15. The plasma processing chamber of claim 9, wherein the pasting material layer comprises an electrically conductive material.

16. The plasma processing chamber of claim 15, wherein the electrically conductive material is aluminum.

17. The plasma processing chamber of claim 9, wherein the pasting material layer thickness ranges from about 1 micron to about 100 microns.

* * * * *